(12) United States Patent
Uchida et al.

(10) Patent No.: US 6,545,212 B1
(45) Date of Patent: Apr. 8, 2003

(54) RADIATION NOISE SUPPRESSING COMPONENT ATTACHMENT STRUCTURE

(75) Inventors: Katsuyuki Uchida, Hikone (JP); Masami Sugitani, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/422,925

(22) Filed: Oct. 21, 1999

(30) Foreign Application Priority Data

Oct. 27, 1998 (JP) .......................................... 10-305413

(51) Int. Cl.⁷ ................................................. H05K 9/00
(52) U.S. Cl. ................. 174/35 R; 174/35 MS; 361/816; 361/818
(58) Field of Search ............... 174/35 R, 35 MS, 174/35 GC, 51; 361/799, 800, 816, 818, 753

(56) References Cited

U.S. PATENT DOCUMENTS

| | | | | |
|---|---|---|---|---|
| 3,809,233 A | * | 5/1974 | Gruszka | 206/328 |
| 5,166,772 A | * | 11/1992 | Soldner et al. | 257/659 |
| 5,171,936 A | * | 12/1992 | Suzuki et al. | 174/35 MS |
| 5,552,965 A | * | 9/1996 | Habegger | 361/801 |
| 5,864,088 A | * | 1/1999 | Sato et al. | 174/35 MS |
| 5,981,043 A | * | 11/1999 | Murakami et al. | 428/209 |

FOREIGN PATENT DOCUMENTS

| | | | | |
|---|---|---|---|---|
| CN | 1115562 | | 1/1996 | |
| JP | 6-11396 | | 2/1994 | |
| JP | 6-45781 | | 2/1994 | |
| JP | 6-68198 | | 9/1994 | |
| JP | 062445852 A | * | 9/1994 | H05K/9/00 |
| JP | 06283882 A | * | 10/1994 | H05K/9/00 |
| JP | 07058487 A | * | 3/1995 | H05K/9/00 |
| JP | 8-18271 | | 1/1996 | |
| JP | 8-204377 | | 8/1996 | |
| JP | 10-41672 | | 2/1998 | |
| JP | 10-84195 | | 3/1998 | |
| JP | 10-117084 | | 5/1998 | |
| JP | 10-134944 | | 5/1998 | |
| JP | 10-163669 | | 9/1998 | |
| JP | 3062159 | | 6/1999 | |
| JP | 2000-40892 | | 2/2000 | |

* cited by examiner

Primary Examiner—Dean A. Reichard
Assistant Examiner—Carmelo Oliva
(74) Attorney, Agent, or Firm—Keating & Bennett, LLP

(57) ABSTRACT

A radiation noise inhibiting component includes a magnetic sheet having a conductor layer which is bonded to the upper side of a CPU mounted on a circuit board. The conductor layer is provided on the surface of the magnetic sheet. The magnetic sheet lies between the conductor layer and the CPU. The conductor layer is grounded to the ground pattern on the circuit board through a conductor.

14 Claims, 2 Drawing Sheets

THICKNESS OF MAGNETIC SHEET (mm)

RADIATION NOISE SUPPRESSING COMPONENT ATTACHMENT STRUCTURE

BACKGROUND OF THE INVENTION

1. Field of the Invention

The present invention relates to a radiation noise suppressing component attachment structure for suppressing noises radiated from an electronic component, a circuit board, or other similar noise emitting apparatus.

2. Description of the Related Art

Generally, a conventional electromagnetic wave absorber for absorbing unnecessary electromagnetic wave noises is defined by a magnetic sheet formed by mixing ferrite or magnetic metal powder with a resin, and processing the mixed material to form a sheet. In addition, another conventional noise suppressing component contains a conductor layer provided on the surface or inside of the magnetic sheet, in which the conductor layer is used as a reflection layer for electromagnetic waves. In this magnetic sheet having the conductor layer, radiation noises are absorbed by the above-described magnetic sheet, and moreover, the radiation noises, which are attenuated in the magnetic sheet, are reflected from the conductor layer, and passed through the magnetic sheet again, where the radiation noises are further attenuated.

However, for practical use, these electromagnetic wave absorbers each are simply bonded to the upper sides of radiation noise generating sources such as electronic components, wiring on circuit boards, and other elements which generate radiation noises. Such an attachment structure has the problem that the radiation noise inhibiting effect achieves a noise prevention amount of only several dB and therefore, a much greater radiation noise inhibiting effect is not possible.

SUMMARY OF THE INVENTION

To overcome the problems described above, preferred embodiments of the present invention provide a radiation noise inhibiting component attachment structure which is simple but achieves a very large radiation noise inhibiting effect.

According to a preferred embodiment of the present invention, a radiation noise inhibiting component attachment structure includes a radiation noise inhibiting component including a magnetic sheet and a conductor layer on the magnetic sheet, the magnetic sheet being arranged to substantially cover a radiation noise generating source and so as to face the radiation noise generating source, and the conductor layer is arranged to substantially cover the magnetic sheet and is grounded.

Preferably, the magnetic sheet is made of a magnetic powder mixed with at least one of a resin and a rubber, and the magnetic powder is made of at least one of ferrite and a magnetic metal. The conductor layer is preferably made of at least one member of the group consisting of metal foils, plating films, metal meshes, conductive pastes, conductive fibers, and conductive sheets.

With the unique structure and arrangement of elements described above, radiation noises radiated from the radiation noise generating source, are absorbed by the magnetic sheet so that the noises are attenuated, and then, are incident upon the conductor layer. Since the conductor layer is grounded, a part of the incident radiation noises are transmitted to the ground through the conductor layer. The remaining radiation noises are reflected from the conductor layer, and passed through the magnetic sheet again where the radiation noises are absorbed so as to be even further attenuated. Accordingly, the radiation noises radiated from the radiation noise generating source are considerably attenuated such that a much greater attenuation of noises is achieved as compared to conventional devices.

Further, in the radiation noise inhibiting component attachment structure according to preferred embodiments of the present invention, preferably, the conductor layer is substantially covered with another magnetic sheet. Accordingly, the radiation noise inhibiting component preferably has a sandwich structure in which the conductor layer is disposed between the two magnetic sheets. Leaking radiation noises, that is, the radiation noises which turn from the sides of the conductor layer toward the back side thereof without flowing through the conductor layer to the ground and also without being reflected from the conductor layer, are attenuated by the magnetic sheet which is disposed at the back of the conductor layer.

In addition, the thickness of the magnetic sheet provided between the radiation noise generating source and the conductor layer is preferably about 0.3 mm or more, so that the radiation noises can be attenuated by about 10 dB or more.

For the purpose of illustrating the present invention, there is shown in the drawings several forms and embodiments which are presently preferred, it being understood, however, that the invention is not limited to the precise arrangements and instrumentality's shown.

DETAILED DESCRIPTION OF PREFERRED EMBODIMENTS

Figure 1:
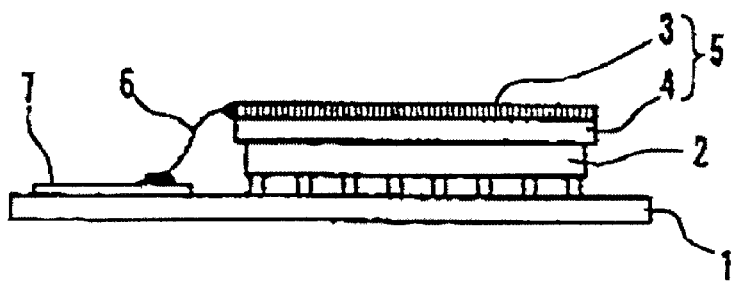
FIG. 1 is a front elevation showing the arrangement of a radiation noise inhibiting component attachment structure according to a first preferred embodiment of the present invention.

FIG. 1 shows a first preferred embodiment of a radiation noise inhibiting component attachment structure according to the present invention. In the first preferred embodiment, the present invention has a structure which is arranged to maximize suppression of radiation noises radiated from the central processor unit 2 (hereinafter, referred to as "CPU") of a personal computer. However, as can be readily understood, the structure and arrangement of preferred embodiments of the present invention may be arranged to maximize suppression of radiation noises from a printed circuit board, an electronic component or other noise producing apparatuses.

The radiation noise inhibiting component 5 is bonded to the upper side of the CPU 2 so as to substantially cover the CPU 2 mounted on a circuit board 1. The radiation noise inhibiting component 5 preferably includes a magnetic sheet 4 and a conductor layer 3 provided on the surface of the magnetic sheet 4.

The magnetic sheet 4 may preferably be a sheet formed from a mixture in which a magnetic powder of ferrite or a magnetic metal is mixed with a resin or rubber. In addition, a metal foil, a plating film, a metal mesh, conductive paste, conductive fibers, a conductive sheet, and so forth may be used as the conductor layer 3. In the first preferred embodiment, about 80% by weight of a Mg—Zn system ferrite magnetic powder with an average particle size of about 15 $\mu$m is preferably mixed with a chlorinated polyethylene. The obtained magnetic resin is extrusion-molded into a magnetic sheet 4 preferably having a thickness of about 1.0 mm.

Subsequently, as shown in FIG. 1, a copper foil defining the conductive layer 3 is bonded to the surface of the magnetic sheet 4, and then, the magnetic sheet 4 having the copper foil 3 is cut preferably to have a size of about 50 mm×50 mm, which is used as the radiation noise inhibiting component 5.

One side of the magnetic sheet 4 of the radiation noise inhibiting component 5 is preferably arranged to face the CPU 2. The magnetic sheet 4 is arranged to contact the CPU 2, and bonded to the upper side of the CPU 2. The magnetic sheet 4 is arranged between the conductor layer 3 and the CPU 2. The conductor layer 3 is grounded to the ground pattern 7 on the circuit board 1 via a conductor 6. The conductor 6 may be made of a material such as a conductive wire, a metal foil, or other suitable conductor element. In order to inhibit the generation of impedance caused by the conductor 6, it is preferable that a conductor 6 that is as short and wide as possible is used.

With the above-described unique structure and arrangement, the radiation noises radiated from the CPU 2 are absorbed by the magnetic sheet 4 so that the noises are attenuated, and then, are incident upon the conductor layer 3. Since the conductor layer 3 is grounded, a portion of the incident radiation noises are transmitted to the ground through the conductor layer 3. The remaining radiation noises are reflected from the conductor layer 3, and pass through the magnetic sheet 4 to be absorbed by the magnetic sheet 4 and are attenuated. Thus, the radiation noises radiated from the CPU 2 are greatly attenuated.

More specifically, the attenuation of the radiation noises at 800 MHz radiated from the CPU 2 was measured. It was confirmed from this measurement that the attachment structure of the radiation noise inhibiting component 5 of the first preferred embodiment attenuates the radiation noises radiated from the CPU 2 by about 15 dB.

Figure 2:
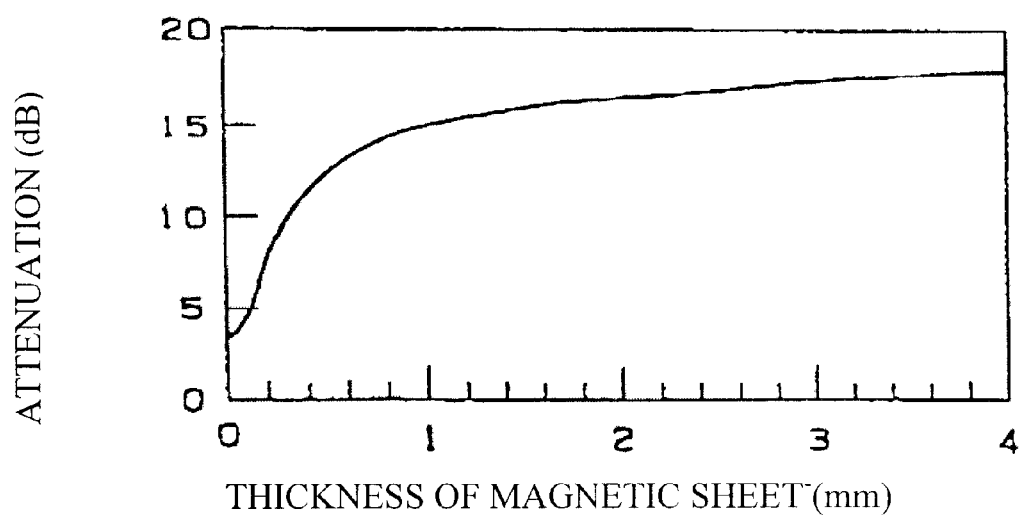
FIG. 2 is a graph showing the relation between the thickness of a magnetic sheet and resulting noise attenuation.

Further, to confirm the effect of the preferred embodiments of the present invention, in the attachment structure of the radiation noise inhibiting component 5 of the first preferred embodiment, the thickness of the magnetic sheet was varied in the range of about 0 mm to about 4 mm, and the radiation noises at 800 MHz radiated from the CPU 2 were measured. The measured results are shown in FIG. 2. The results reveal that the attenuation of the radiation noises at 800 MHz by about 10 dB or more can be achieved when the thickness of the magnetic sheet 4 is about 0.3 mm or more.

Figure 3:
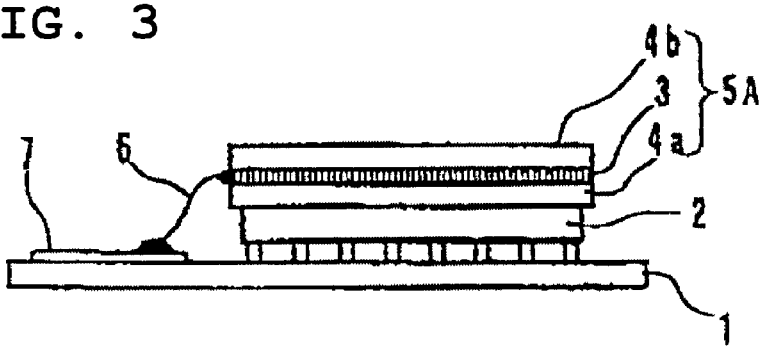
FIG. 3 is a front elevation showing the arrangement of a radiation noise inhibiting component attachment structure according to a second preferred embodiment of the present invention.

Further, in the radiation noise inhibiting component attachment structure according to preferred embodiments of the present invention, as shown in FIG. 3, the radiation noise inhibiting component 5A may have a sandwich structure (second preferred embodiment) which preferably includes two magnetic sheets 4a and 4b, and the conductor layer 3 provided between the two magnetic sheets 4a and 4b. With this sandwich structure, the leaking radiation noises, that is, those noises which turn from the sides of the conductor layer 3 toward the back side of the conductor layer 3 without being transmitted to the ground through the conductor layer 3 and without being reflected from the conductor layer 3, are attenuated by the magnetic sheet 4b which is additionally provided on the back side of the conductor layer 3. Thus, the radiation noises can be further decreased.

According to the second preferred embodiment, a mesh unit containing nickel wires knitted therein defines the conductor layer 3 and is sandwiched between the magnetic sheets 4a and 4b which are prepared preferably using the same process as in the first preferred embodiment, embedded therebetween by thermal compression, and cut into pieces each preferably having a size of about 50 mm×50 mm whereby a radiation noise inhibiting component 5A is produced. As shown in FIG. 3, this radiation noise inhibiting component 5A is preferably bonded to the upper side of the CPU 2 mounted on the circuit board 1 with the magnetic sheet 4a being arranged to contact the upper side of the CPU 2. Further, the mesh unit 3 is preferably soldered to the ground pattern 7 of the circuit board 1 through the conductor 6.

The attenuation of the radiation noises at 800 MHz in the second preferred embodiment was measured. It was confirmed that the radiation noises radiated from the CPU 2 are attenuated by about 18 dB.

Figure 4:
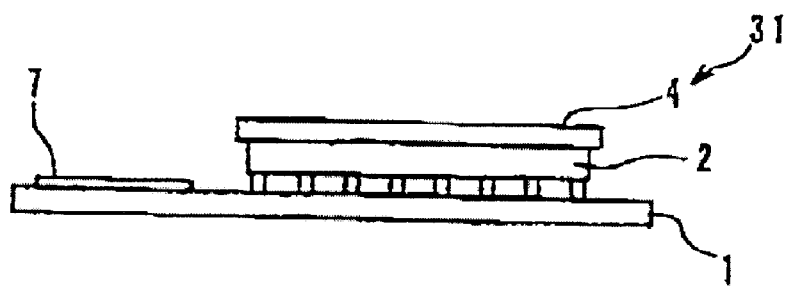
FIG. 4 is a front elevation showing the configuration of an example prepared for comparison to preferred embodiments of the present invention.

As a comparison example 1 of the radiation noise inhibiting component attachment structure, the magnetic sheet 4 produced by the same procedure as in the above-described first preferred embodiment was cut into pieces each having a size of approximately 50 mm×50 mm whereby a radiation noise inhibiting component 31 was produced. The radiation noise inhibiting component 31 was bonded to the upper side of the CPU 2 mounted on the circuit board 1 as shown in FIG. 4. Then, the attenuation of the radiation noises at 800 MHz was measured. As a result, it was determined that with the attachment structure of the radiation noise inhibiting component 31 of comparison example 1, the radiation noises radiated from the CPU 2 were attenuated only by about 3 dB. That is, it was confirmed that a sufficient attenuation can not be attained by use of the magnetic sheet 4 only.

Figure 5:
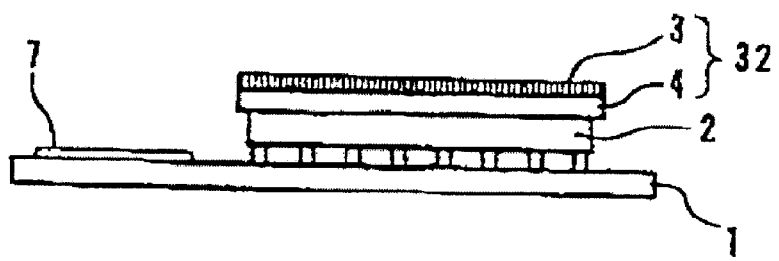
FIG. 5 is a front elevation showing the configuration of a further example prepared for comparison to preferred embodiments of the present invention.

Further, as a comparison example 2 of the radiation noise inhibiting component attachment structure, a radiation noise inhibiting component 32 including the magnetic sheet 4 and the copper foil 3 was produced by the same procedure as in the first preferred embodiment. The radiation noise inhibiting component 32 was bonded in such a manner that the magnetic sheet 4 was arranged to contact the upper side of the CPU 2, as shown in FIG. 5. However, the copper foil 3 was not electrically connected to the ground pattern 7 of the circuit board 1, but instead was arranged in a floating, unconnected state. The attenuation of the radiation noises at 800 MHz was measured. As a result, with the attachment structure of the radiation noise inhibiting component 32 of comparison example 2, the radiation noises radiated from the CPU 2 were attenuated only by about 5 dB. The radiation noises attenuated by the magnetic sheet 4 were reflected from the copper foil 3, and passed again through the magnetic sheet 4. Accordingly, though it was determined that the attenuation effects are enhanced to some degree as compared with the comparison example 1, however, a much larger attenuation effect as achieved in the first and second preferred embodiments of the present invention could not be attained with comparison example 2.

Figure 6:
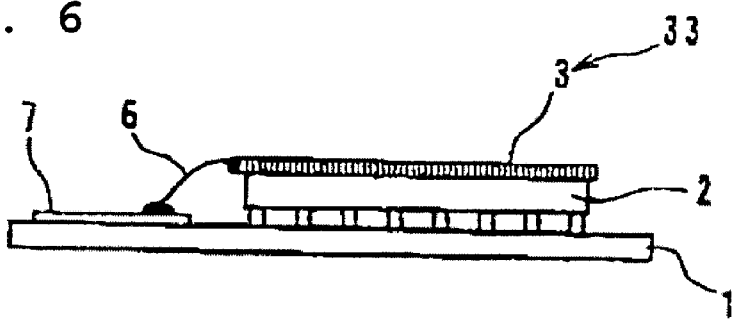
FIG. 6 is another front elevation showing the configuration of still another example prepared for comparison to preferred embodiments of the present invention.

Further, as a comparison example 3 of the radiation noise inhibiting component attachment structure, a radiation noise inhibiting component 33 including a copper foil 3 cut in a size of about 50 mm×50 mm was prepared. The radiation noise inhibiting component 33 was bonded to the upper side of the CPU 2 mounted on the circuit board 1 as shown in FIG. 6. The copper foil 3 was electrically connected to the ground pattern 7 on the circuit board 1 through the conductor 6. The attenuation of the radiation noises at 800 MHz was measured. As a result, with the attachment structure of the radiation noise inhibiting component 33 of comparison example 3, the radiation noises radiated from the CPU 2 were attenuated only by about 3 dB. It was confirmed that a sufficient attenuation can not be achieved by use of the copper foil 3 only.

Figure 7:
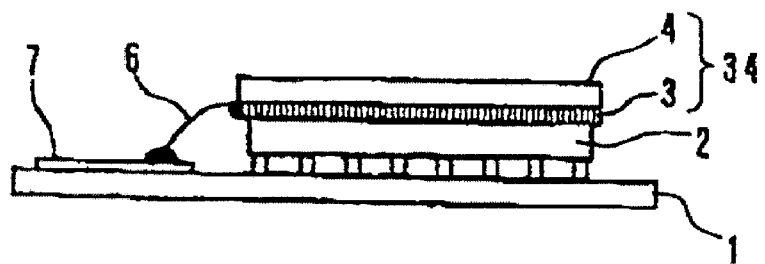
FIG. 7 is still another front elevation showing the configuration of another example prepared for comparison to preferred embodiments of the present invention.

As a comparison example 4 of the radiation noise inhibiting component attachment structure, a radiation noise inhibiting component 34 including the magnetic sheet 4 and the copper foil 3 was produced using the same procedure as in the above-described first preferred embodiment. The radiation noise inhibiting component 34 was bonded with the copper foil 3 and arranged to contact the upper side of the CPU 2, that is, the copper foil is sandwiched between the magnetic sheet 4 and the CPU 2, and the copper foil 3 is electrically connected to the ground pattern 7 on the circuit board 1 through the conductor 6, as shown in FIG. 7. The attenuation of the radiation noises at 800 MHz was measured. As a result, it was determined that with the attachment structure of the radiation noise inhibiting component 34 of comparison example 4, the radiation noises radiated from the CPU 2 could be attenuated only by about 3 dB as is similar with the comparison example 3. That is, it was determined that in the attachment structure of the radiation noise inhibiting component 34 of comparison example 4, the copper foil 3 directly contacts the CPU 2 to provide an electromagnetic shield, and therefore, the magnetic sheet 4 positioned on the opposite side to the CPU 2 with respect to the copper foil 3 makes substantially no contribution to the radiation noise inhibition.

The radiation noise inhibiting component attachment structure according to the present invention is not limited to the above-described preferred embodiments, and various changes may be made without departing from the sprit of the invention. In particular, the radiation noise source is not limited to the CPU 2 as described in the above preferred embodiments. More specifically, electronic components such as transistors which carry out switching operations, circuit boards, patterns on circuit boards, and other noise generating elements are included in the radiation noise source.

As seen in the above description, according to preferred embodiments of the present invention, radiation noises radiated from a radiation noise generating source are absorbed by the magnetic sheet to be attenuated, and then, are incident upon the conductor layer. A portion of the radiation noises are transmitted to the ground. The remaining radiation noises are reflected from the conductor layer, and passed through the magnetic sheet again to be absorbed and attenuated by the magnetic sheet. As a result, the radiation noises radiated from the radiation noise generating source are greatly reduced. That is, a very high radiation noise inhibiting effect is achieved. In addition, according to preferred embodiments of the present invention, for application, only the grounding of the conductor layer is necessary. In contrast to the conventional radiation noise inhibiting component attachment structure, a high radiation noise inhibiting effect can be easily and reliably achieved in preferred embodiments of the present invention without the number of manufacturing processes being significantly increased.

While preferred embodiments of the present invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A radiation noise inhibiting component attachment structure comprising:
   a radiation noise inhibiting component including a magnetic sheet and a conductor layer arranged such that the magnetic sheet substantially covers a radiation noise generating component and directly contacts the radiation noise generating component, and the conductor layer substantially covers the magnetic sheet and is grounded; wherein
   the magnetic sheet comprises magnetic powder mixed with at least one of a resin and a rubber, and the magnetic powder is made of at least one of ferrite or a magnetic material;
   the conductor layer comprises at least one of the group consisting of metal foils, plating films, metal meshes, conductive pastes, conductive fibers, and conductive sheets;
   the magnetic sheet disposed between the radiation noise generating component and the conductor layer has a thickness of about 0.3 mm or more; and
   the radiation noise inhibiting component is sheet-shaped and separable from the noise generating component.

2. A radiation noise inhibiting component attachment structure according to claim 1, wherein the conductor layer is substantially covered with another magnetic sheet.

3. A radiation noise inhibiting component attachment structure according to claim 1, wherein the conductor layer comprises a metal mesh unit made of knitted nickel wires.

4. A radiation noise inhibiting component attachment structure according to claim 3, wherein two magnetic sheets are provided and the conductor is disposed between the two magnetic sheets.

5. A radiation noise inhibiting component attachment structure according to claim 3, wherein the magnetic sheet has a thickness of about 1.0 mm.

6. A radiation noise inhibiting component attachment structure according to claim 1, wherein the magnetic sheet is made of 80% by weight of a Mg—Zn system ferrite magnetic powder with an average particle size of about 15 ρm and a chlorinated polyethylene.

7. A radiation noise inhibiting component attachment structure according to claim 1, wherein the radiation noise generating source is a central processing unit of a computer.

8. A radiation noise inhibiting component attachment structure according to claim 1, wherein the radiation noise generating source is a printed circuit board.

9. An electronic apparatus comprising:
   a radiation noise generating component; and
   a radiation noise inhibiting component including a magnetic sheet and a conductor layer arranged such that the magnetic sheet substantially covers the radiation noise generating component and directly contacts the radiation noise generating component, and the conductor layer substantially covers the magnetic sheet and is grounded; wherein the magnetic sheet comprises magnetic powder mixed with at least one of a resin and a rubber, and the magnetic powder is made of at least one of ferrite or a magnetic material;

the conductor layer comprises at least one of the group consisting of metal foils, plating films, metal meshes, conductive pastes, conductive fibers, and conductive sheets;

the magnetic sheet disposed between the radiation noise generating component and the conductor layer has a thickness of about 0.3 mm or more; and the radiation noise inhibiting component is sheet-shaped and separable from the noise generating component.

10. An electronic apparatus according to claim 9, wherein the radiation noise generating source is a central processing unit of a computer.

11. An electronic apparatus according to claim 9, wherein the radiation noise generating source is a printed circuit board.

12. An electronic apparatus according to claim 9, wherein the conductor layer is substantially covered with another magnetic sheet.

13. An electronic apparatus according to claim 9, wherein the conductor layer comprises a metal mesh unit made of knitted nickel wires.

14. An electronic apparatus according to claim 13, wherein two magnetic sheets are provided and the conductor is disposed between the two magnetic sheets.

* * * * *